United States Patent [19]

Miller

[11] 4,203,781
[45] May 20, 1980

[54] LASER DEFORMATION OF SEMICONDUCTOR JUNCTIONS

[75] Inventor: Gabriel L. Miller, Westfield, N.J.

[73] Assignee: Bell Telephone Laboratories Inc., Murray Hill, N.J.

[21] Appl. No.: 973,713

[22] Filed: Dec. 27, 1978

[51] Int. Cl.$^2$ .................. H01L 21/26; H01J 37/30
[52] U.S. Cl. .................. 148/1.5; 219/121 L; 357/91; 427/35; 427/53.1
[58] Field of Search .............. 148/1.5; 357/91; 219/121 L; 427/53, 35

[56] References Cited

U.S. PATENT DOCUMENTS

| | | | |
|---|---|---|---|
| 3,420,719 | 1/1969 | Potts | 148/188 |
| 3,461,547 | 8/1969 | DiCurcio | 29/574 |
| 3,765,961 | 10/1973 | Mars | 148/175 |
| 3,771,026 | 11/1973 | Asai et al. | 317/234 R |
| 3,940,289 | 2/1976 | Marquardt et al. | 148/1.5 |
| 3,940,784 | 2/1976 | Diguet | 357/20 |
| 4,082,958 | 4/1978 | Kirkpatrick | 250/492 B |

OTHER PUBLICATIONS

Fairfield et al., "Si–Diode by Laser . . . ", Solid St. Electronics, 11 (1968), 1175.
Joshi et al., ". . . Impurity Migration . . . by Lasers", IBM-TDB, 11 (1968), 104.
Narayan et al., "P-N Junction . . . by Laser . . . Diffusion", Appl. Phys. Letts. 33, (1978) 338.
Geiler et al., ". . . Laser-Induced Diffusion . . . ", Phys. Stat. Solidi, 41a (1977) K-171.
Marquardt et al., ". . . Laser Damaged Junction Dences", Rad. Effects, 23, (1974) 135.
Kirkpatrick et al., ". . . Pulsed Energy Processing", Conf. Record, 12th. IEEE Photovoltaic . . . Conf., 1976, p. 299.
Young et al., "Laser Annealing . . . Si", Appl. Phys. Lett. 32, (Feb. 1978) 139.
Zeigler et al., "Self-Isolating . . . Transistor", IBM-TDB, 14, 1971; 1635.
Platakis, ". . . Laser Induced . . . Connections in MOS . . . ", Jour. Appl. Phys. 47, (1976) 2120.
Guliuni et al., ". . . Laser Damaged Phototransistors", Jour. Appl. Phys. 45, (1974) 4993.
Kutukova et al., "Laser Annealing . . . Si", Sov. Phys. Semicond-10, (1976), 265.
Antonenko et al., ". . . Impurity in Si After Laser . . . ", Sov. Phys. Semicond., 10, (1976) 81.
Kachurin et al., ". . . Implanted Layer . . . Laser Beam", Sov. Phys. Semicond. 10, (1976) 1128.
Khaibullin et al., ". . . Si Layers . . . Laser Annealing", Sov. Phys. Semicond. 11, (1977) 190.
Dvurechensky et al., ". . . laser Annealing . . . S/C", Proc. U.S.-U.S.S.R. Conf. Ion–Implantation, Albany, Jul. 1977.
Celler et al., ". . . Implanted Si by Laser . . . ", Appl. Phys. Lett. 32, (Apr. 1978) 464.
Seidel et al., "Laser Annealed . . . Transistors", Conf. . . . "S/C Materials & Devices",Seattle, Wa. May 1978.
Auston et al., ". . . Reflectivity of . . . Si . . . ", Appl. Phys. Lett. 33, (Sep. 1978) 437.
Venkatesan et al., ". . . Laser . . . As-Implanted Si", Appl. Phys. Lett. 33 (Sep. 1978) 429.
Bean et al., ". . . Laser Crystallization . . . Si", Appl. Phys. Lett. 33, (Aug. 1978) 227.
Auston et al., "Laser Annealing . . . Si", Appl. Phys. Lett. 33, (Sep. 1978) 539.
A. S. Grove, Ed., Physics & Technology of S/C Denior, Wiley, N.Y. 1967, pp. 44–47.

*Primary Examiner*—L. Dewayne Rutledge
*Assistant Examiner*—Upendra Roy
*Attorney, Agent, or Firm*—Peter V. D. Wilde

[57] ABSTRACT

A method of changing the geometry of p-n or isotype junctions in semiconductor crystal material by laser or electron beam melting through a portion of the junction is described. Two adjoining regions are doped at different levels and a laser or electron beam melts through a portion of one region into the other region any desired depth. Upon cooling, the melt epitaxially recyrstallizes, producing a deformation in the otherwise planar junction that extends the more heavily doped region into the more lightly doped region. In the case of reverse-biased diodes, such as zener or avalanche diodes, this can be used to either increase the field in a portion of the depletion region, or push a portion of the junction into a more heavily doped region, or both, which reduces the breakdown voltage. Also, a method of controlling a pulsed laser or electron beam while continuously monitoring the breakdown voltage of the diode to obtain the desired breakdown voltage is described. The method is also useful for reducing the channel width of field effect transistors, and for making contact to buried doped regions and creating isolated surface regions.

15 Claims, 15 Drawing Figures

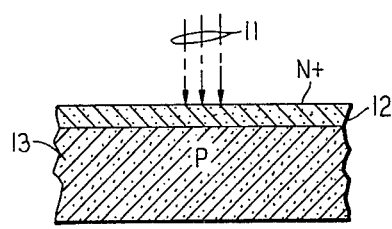
FIG. 1
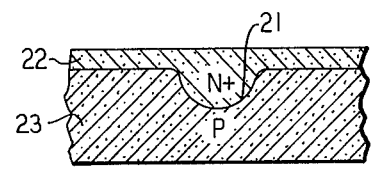
FIG. 2
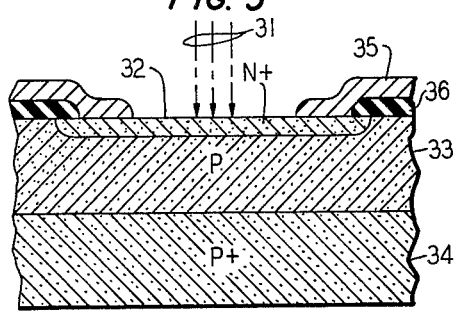
FIG. 3
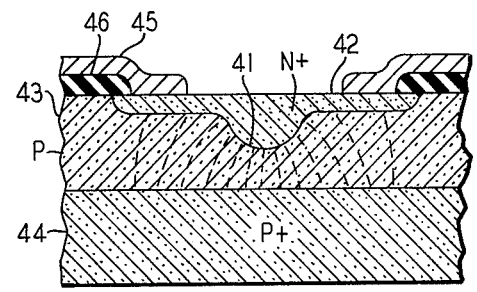
FIG. 4
FIG. 5
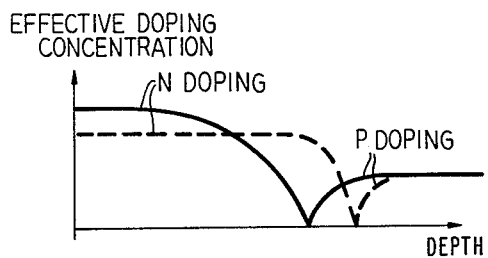
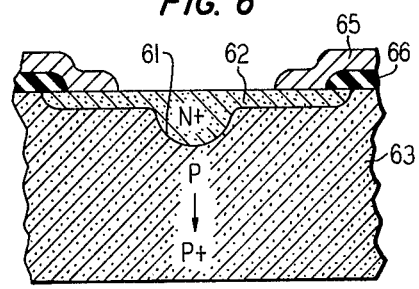
FIG. 6
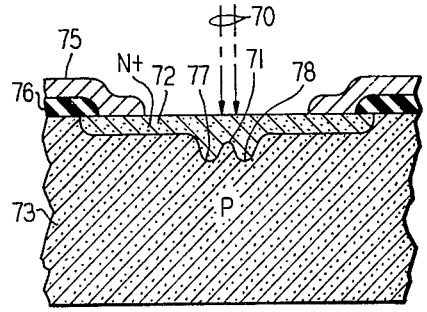
FIG. 7
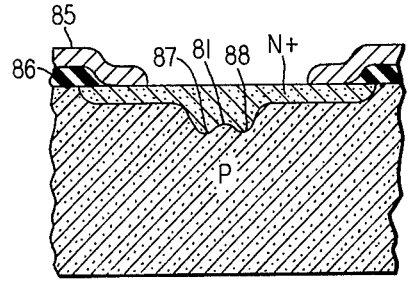
FIG. 8

LASER DEFORMATION OF SEMICONDUCTOR JUNCTIONS

TECHNICAL FIELD

Semiconductor devices, barrier junctions, p-n junctions, isotype junctions, zener or avalanche diodes, field effect transistors, buried doped regions.

BACKGROUND OF THE INVENTION

Recent work in several countries has been conducted on radiation annealing to return amorphous semiconductor surface regions to the crystal state. In particular, if the radiation source is a laser capable of melting the semiconductor to a depth at least equal to the depth of the amorphous surface region, it has been shown by many workers in the art that the molten region will regrow epitaxially on the unmelted crystal substrate, thus returning the molten region to the crystal state. "Laser Annealing of Implanted Silicon," O. G. Kutukova and L. N. Streltsov, *Sov. Phys. Semicond.*, 10, 265 (1976); "Spatially Controlled Crystal Regrowth of Ion Implanted Silicon by Laser Irradiation," G. K. Celler, J. M. Poate and L. C. Kimerling, *Appl. Phys. Lett.*, Vol. 32, No. 8 (Apr. 15, 1978).

It is also known that diffusion of dopant atoms in silicon proceeds very rapidly while the silicon is in the molten state. "Time-Resolved Reflectivity of Arsenic-Implanted Silicon During Laser Annealing," D. H. Auston, C. M. Surko, T. N. C. Venkatesan, R. E. Slusher, and J. A. Golovchenko, *Appl. Phys. Lett.*, Vol. 33, No. 5 (Sept. 1, 1978), p. 437.

Further, it is possible for a change in dopant distribution to occur as the liquid-solid interface moves through the material during resolidification, due to the difference of solubility of the dopant atoms in the liquid as compared to the solid semiconductor. This effect is referred to as segregation of impurities. "Distribution of an Implanted Impurity in Silicon after Laser Annealing," A. Kh. Antonenko, N. N. Gerasimenko, A. V. Dvurechenskii, L. S. Smirnov, and G. M. Tseitlin, *Sov. Phys. Semicond.*, Vol. 10, p. 81 (1976); "On the Mechanisms of Impurity Redistribution at The Laser Annealing of Ion Implanted Semiconductors," A. V. Dvurechensky, G. A. Kachurin, A. K. Antonenko, presented at the U.S.-U.S.S.R. Seminar on Ion Implantation, July 4–6, 1977, Albany, N.Y.

In addition, both the diffusion and segregation effects have been observed when a semiconductor device (a phototransistor) was subjected to laser radiation. "Observation of Impurity Migration in Laser-Damaged Junction Devices," C. L. Marquardt, J. F. Giuliani and F. W. Fraser, *Radiation Effects*, Vol. 23, pp. 135–139 (1974); "Electrical Effects in Laser-Damaged Phototransistors," J. F. Giuliani and C. L. Marquardt, *Journal of Applied Physics*, Vol. 45, No. 11, pp. 4993–4996 (November 1974). This work was also the basis of U.S. Pat. No. 3,940,289 granted to C. L. Marquardt and J. F. Giuliani, entitled "Flash Melting Method for Producing New Impurity Distributions in Solids." The Marquardt patent teaches primarily the use of the segregation effect at the solid-liquid interface to obtain impurity redistribution.

The usefulness of localized dopant redistribution to change p-n junction geometries can be appreciated by reference to semiconductor devices in which the magnitude of an electric field defines important parameters of operation. For example, the reverse breakdown voltage of zener or avalanche diodes depends on, among other things, the electric field in the junction. The electric field in turn depends on the geometry of the junction. Also, it is well known that for stable, low-noise operation, the breakdown in such diodes should occur in the buried region of the junction, away from the surface. It would be useful therefore if a technique were available whereby a portion of the p-n junction residing in the buried region could be selectively deformed, changing the electric field for a given applied voltage, and hence changing the breakdown voltage.

The channel width of a junction field effect transistor has an important effect on the pinch-off voltage and other parameters of operation of the device. It would be useful therefore if a portion of the channel width could be tailored to almost any desired configuration. In another area of possible application, the prior art teaches the use of buried doped regions in making various semiconductor devices. However, making ohmic contact to such regions may require such time-consuming steps as etching away a small portion of the overlying material and making metallic contact. It would be very useful if a conducting channel could be rapidly formed from an overlying region to the buried regions, or between buried regions. Also, for such uses as large scale integration where different areas of the chip are used for different functions, it would be very useful to be able to rapidly isolate regions by a p-n junction.

SUMMARY OF THE INVENTION

I have devised a new method for changing the geometry of p-n junctions or isotype junctions in single crystal semiconductor material. It utilizes a laser or electron beam to melt through a portion of the junction so that the more heavily doped side of the junction extends into the less heavily doped side, thereby deforming a portion of the junction. This is useful for changing the electric field in zener or avalanche diodes, allowing precise adjustment of the breakdown voltage. As the junction is modified so that breakdown preferentially occurs in the buried region, surface effects are avoided, resulting in more stable operation. Although the breakdown voltage is normally reduced by this method, a voltage increase capability is possible. This allows the breakdown voltage to be partially returned to the original level after a reduction.

In one embodiment, for precise control of the adjustment process, a pulsed laser or electron beam is used while continuously monitoring the reverse breakdown voltage.

The p-n junctions or isotype junctions in other device structures can also be modified, such as the channel width in junction field effect transistors. The method can also be used for making ohmic contact to buried doped regions from overlying regions, or for making contact between buried doped regions. It can also be used to make isolated buried or surface regions.

BRIEF DESCRIPTION OF THE DRAWINGS

FIGS. 1 and 2 show a p-n junction before and after radiation;

FIGS. 3 and 4 show a zener or avalanche diode fabricated on an epitaxial substrate before and after radiation;

FIG. 5 shows the change in doping profile due to radiation melting in the case of p-n junction formed by diffusion;

FIG. 6 shows a dimple that is pushed into a more heavily doped portion of the p region;

FIGS. 7 and 8 show a technique for increasing the breakdown voltage after a prior decrease by eliminating previously formed sharp curves;

DETAILED DESCRIPTION

Figure 9:
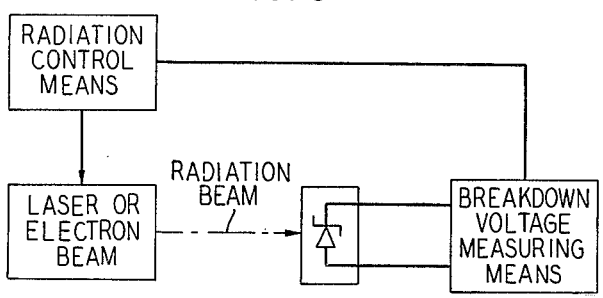
FIG. 9 shows a circuit arrangement for precisely controlling the radiation output while monitoring the breakdown voltage.

The following detailed description covers devices and a method for making them in which the geometry of a semiconductor p-n junction or isotype junction is altered by laser or electron beam melting. This can be used for such purposes as adjusting the reverse breakdown voltage in zener or avalanche diodes, changing the channel width of field effect transistors, making ohmic contact to buried doped regions, isolating surface or buried regions, or other applications yet to be devised.

An isotype junction is herein defined as a junction between regions of the same semiconductor type that are doped at different levels. Examples of isotype junctions are p-p+ junctions n-n+ junctions. Since relative doping levels are involved, p-p− junctions and n-n− junctions, etc. are also included in the present teaching.

The sequence of steps included in this method can be understood by referring to FIGS. 1 and 2. A p-n junction is depicted, but an isotype junction could likewise be shown, wherein a more heavily doped semiconductor 12 is in contact with a more lightly doped semiconductor of the opposite type 13. A p-n+ junction is shown here and in the following Figures, but complementary types are possible. A comparable isotype junction occurs if region 13 (and 23) are n instead of p, thus forming an n-n+ function, with complementary types also possible. As shown in FIG. 1 and the following Figures, the buried region of the function is initially planar, but other initial configurations are possible.

The structure is then exposed to a source of high intensity radiation directed along the dotted lines 11 as shown in FIG. 1. The diameter of the beam is less than 100 microns, and typically is on the order of 40 microns. In any case, the radiation beam is arranged to be of smaller cross-sectional area than the area of the p-n or isotype junction. The radiation source is a laser or electron beam having an energy, wavelength and exposure duration sufficient to couple enough power into the semiconductor to melt the material to a depth beyond the junction. As noted above the prior art teaches that the molten region will regrow epitaxially on the unmelted region during resolidification. It is evident that the melting step must take place in a brief time if regrowth is to occur in a well-defined region as suggested by FIG. 2. It is known that both laser and electron beam radiation are capable of creating a molten region with a molten lifetime of less than 1 $\mu$sec. This is believed adequate for purposes of this invention. A laser is the preferred radiation source referred to hereinafter, due to the ease of obtaining a small beam diameter. However, it is to be understood that an electron beam radiation source can also be used.

It will be noted that for the p-n+ junction shown in FIG. 2, the n dopant atoms mix with the p atoms during the molten lifetime, tending to produce an n+ doping in the dimple 21, since the n atoms are of a higher concentration in the n+ region 22 than the p atoms are in the p region 23. Similarly, for an n-n+ junction (not shown), the dimple would assume an n+ doping level. Note that the term "more heavily doped" with regard to FIG. 1 means that the concentration of n dopant in region 12 exceeds the concentration of p dopant in region 13. Otherwise, the p region 13,23 in FIGS. 1 and 2 could actually consist of n+ doping and an even greater p+ doping to give an effective p doping level. In that case, the mixing of atoms in the melt would not produce an n+ doping in the melt.

Melting into the more heavily doped region first will tend to ensure that the melt will assume an n+ doping level, as a greater volume of the melt will come from the $n^{+0}$ region than if the laser melted into the more lightly doped p region first. However, as will be discussed later in connection with FIGS. 14 and 15, p-n or isotype junctions can also be deformed by melting into the less heavily doped region first, if the melt extends sufficiently far into the more heavily doped region.

The length that the n dopant atoms will diffuse into the melt is given by the well-known diffusion formula, $l = \sqrt{2 Dt}$, where l is the length of the diffusion, D is the diffusion constant of the n dopant in the molten semiconductor, and t is the time the semiconductor is in the molten state; see, for example, *Physics and Technology of Semiconductor Devices*, A. S. Grove, John Wiley & Sons, (1967), p. 46. The results of Rutherford backscattering (RBS) measurements indicate that the diffusion lengths occurring in practice agree reasonably well with this formula; "Time Resolved Reflectivity of Arsenic-Implanted Silicon During Laser Annealing," D. H. Auston et al., *Applied Physics Letters*, 33 (5), pp. 437–439 (Sept. 1, 1978). This implies that if the molten lifetime is long compared to the time required for diffusion to occur through the length of the dimple, the n atoms will have diffused throughout the melt and the entire dimple will assume an n+ doping level before resolidification occurs. However, if the molten lifetime is short compared to the time required for diffusion to occur throughout the melt, then the size of the n+ doped dimple will be smaller than the size of the molten dimple.

The resolidification process may also affect the dopant distribution. This is due to the well-known segregation effect, which forms the basis of zone refining of semiconductors. If the distribution coefficient, defined in this case as the ratio at equilibrium of solubility of impurities in the semiconductor in the solid phase as compared to the liquid phase, is less than 1, then the dopant atoms will tend to be removed from the melt as the solid-liquid interface advances during resolidification. Thus, the n dopant atoms could be removed from the dimple upon resolidification. However, this effect is significant only under quasi-thermal equilibrium conditions. If the resolidification proceeds rapidly enough, the system will be in such thermal disequilibrium that no significant dopant redistribution will occur due to this effect, and the dimple will remain n+ in this example. Rapid resolidification is enhanced in the present invention, as the laser spot size is small compared to the area of the junction, and thus the solid material surrounding the melt stays relatively cool if the melt time is short. For the melt times normally involved in practicing the present invention, less than 1 μsec and typically on the order of 100 nsec per laser pulse, and for laser beam diameters less than 100 microns, for such commonly used dopants as antimony and phosphorous in silicon, it is believed no significant redistribution due to the segregation effect occurs.

The foregoing effects can be used for altering the reverse breakdown voltage of zener or avalanche diodes. Consider the reverse-biased diode of FIG. 3, before being radiated by a laser beam 31 shown by dashed lines. Breakdown typically occurs initially in the planar portion of the junction. The depletion region extends only the width of the p region 33, but does not extend significantly into the p+ region 34, due to its much higher effective doping level. Now consider that laser radiation is applied sufficiently to produce a dimple 41 in the junction as discussed above, and as shown in FIG. 4. Due to the curvature of the dimple and the decrease in width of the depletion region, the electric field will be increased in the dimpled portion of the junction, and breakdown will occur at a lower voltage than required before laser radiation. By pushing the dimple into the p region 43 any desired depth by one or more laser pulses, the breakdown voltage can thus be adjusted to any desired value less than the initial value.

If, due to surface impurities, breakdown occurs at the edges of the junction near the surface, unstable and noisy operation will frequently result. By applying laser radiation, the dimple can be pushed in far enough so that breakdown preferentially occurs in the dimpled buried region. More stable operation will result.

In addition to the change in electric field due to the change in the geometry of the junction, the change in doping distribution within a region will also alter the electric field distribution. In FIG. 5, the doping profile of a typical diffused p-n junction before melting is shown in solid lines. The junction is defined by the crossover point where the actual n and p doping levels are equal, and hence the effective doping level is zero. If a laser melts through the n layer down to the level of the p-n junction, dopant atoms will redistribute themselves in the melt more equally due to diffusion as discussed above. This will make the n doping profile more constant in most of the n region, dropping off more rapidly near the junction, as shown by the dotted lines in FIG. 5. The more rapid n to p transition implies that the electric field will be increased at the p-n junction for a given applied reverse voltage, and thus breakdown will occur at a lower reverse voltage. The location of the melted portion of the junction may also be moved, as indicated in FIG. 5, which changes the geometry as discussed above.

A third effect of laser melting that reduces the breakdown voltage of a reverse-biased diode results from grading the impurity distribution where the dimple occurs. FIG. 6 shows a diode in which the p region makes a gradual transition to the p+ substrate so that the dimpled portion of the junction is in a more heavily doped portion of the p region than is the rest of the junction. This is in contrast to the situation of FIG. 4, where the p region is of essentially constant doping. Thus, in FIG. 6, since breakdown tends to occur at lower electric field levels in more heavily doped regions, breakdown will occur in the vicinity of the dimple first, thus lowering the breakdown voltage.

To allow for correction of possible overshoot of the voltage reduction, a voltage increase capability may be provided. This is accomplished by eliminating previously formed sharp curves in the deformation area by means of subsequent laser pulses. In FIG. 7, the initial voltage reduction is accomplished by two adjacent dimples 77,78. Breakdown occurs first in the vicinity of maximum curvature of the dimples, due to the high electric field existing there. In FIG. 8, laser radiation has partially pushed out the sharp curve 81, thereby reducing the electric field and increasing the breakdown voltage. Experiments with the two-dimple configuration have thus far shown a voltage increase capability of about 5 percent of the initial voltage reduction. Other initial configurations are also possible.

One advantage of the present method is the ability to monitor the breakdown voltage between laser pulses, allowing rapid and precise adjustment to the desired value. As shown in FIG. 3, the electrical connection 35 to the n region of the junction is formed prior to the laser radiation step, as is the substrate connection (not shown). This allows connection of the diode to external voltage breakdown measuring means during the radiation process. The time the radiated region is molten can be very short, typically on the order of 100 nsec per laser pulse, allowing the return of the melt to the solid state for voltage measuring purposes between laser pulses while maintaining a higher laser pulse rate.

If the molten zone lifetime for each laser pulse is of short duration compared to the total melt time needed for adjustment to the desired value, each individual laser pulse will change the breakdown voltage by an amount small compared to the total desired reduction. Thus, by controlling the total number of pulses, the breakdown voltage can rapidly be adjusted to the desired value with any precision desired, depending on the length of each laser pulse. In addition, the process could be made even more rapid while maintaining high precision by making the initial laser pulses of higher amplitude or duration, and decreasing the amplitude or duration of subsequent pulses as the desired breakdown voltage is approached.

In FIG. 9 is shown in block diagram form a circuit arrangement to achieve such laser control. The voltage monitoring means measures the breakdown voltage between laser pulses, and includes means for comparing the measured voltage to a desired value. Upon reaching the desired value to within a given tolerance, the monitoring means signals the radiation control means to terminate the laser pulses. The radiation control means can simply control the number of laser pulses, or can additionally control the amplitude and/or width of the laser pulses as the desired value is approached, as discussed above.

Alternately or additionally, the voltage increase capability described in connection with FIGS. 7 and 8 can be used for final adjustment of the breakdown voltage. In this case, a small amount of overshoot in the voltage reduction beyond the desired value could be tolerated, or even purposely produced, while allowing the final adjustment to be made by the small increase in breakdown voltage previously described.

Figure 10:
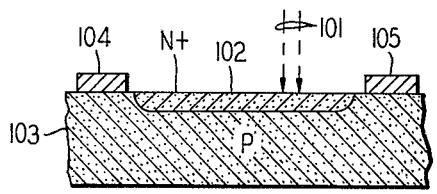
FIGS. 10 and 11 show the change in channel width of a field effect transistor by radiation melting.

Other uses for the p-n junction deformation technique can readily be visualized. For example, a junction field effect transistor has the structure depicted in FIG. 10, where the n+ region 102 forms the gate between the source 104 and drain 105 contacts on the p region. At least one parameter of device operation, the pinch-off voltage, depends upon the width of the channel under the gate. By laser deformation of the p-n junction, this width can be reduced in a portion of the channel.

Figure 11:
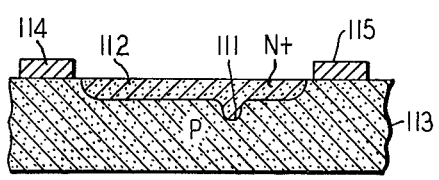

One geometry that could accomplish this is shown in FIG. 11. Here, the junction deformation 111 is a trough running perpendicular to the plane of the drawing, which appears as a dimple in cross section. Such a trough could be formed by moving the laser beam across the gate during the formation of the melt. This would provide for increased electric field in a portion of the channel for a given gate-to-source voltage. Since the source-to-drain current flow is controlled by the electric field in the channel, such an increase in the field would result in a reduction of the pinch-off voltage of the device. Other device parameters could also be modified.

Furthermore, monitoring of some device parameter, such as the source-to-drain current for a given source-to-drain voltage and gate-to-source voltage could readily provide a method of controlling the extent of laser radiation to achieve the desired properties in a manner analogous to that discussed in connection with FIG. 9.

Figure 12:
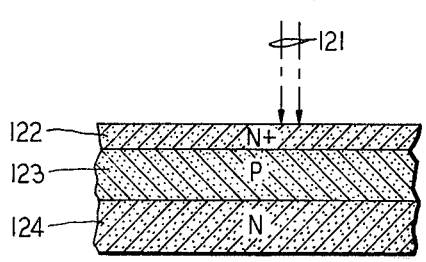
FIGS. 12 and 13 show making contact to a buried doped region, or isolating buried regions, by radiation melting through a more heavily doped overlying layer.
Figure 13:
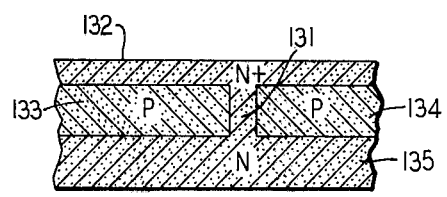

Another use of this technique is for making contact to buried doped regions. Shown in FIG. 12 is a semiconductor structure in which it is desired to make ohmic contact between the more heavily doped overlying region 122 and the buried region 124. By melting from the n+ region through the p region 123 down to the n region 124, an n+ channel 131 can be formed, as shown in FIG. 13, achieving the desired connection.

Figure 14:
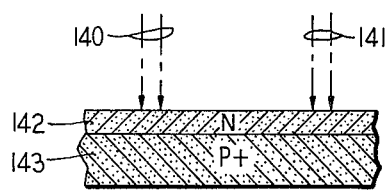
FIGS. 14 and 15 show making contact to a buried region or isolating surface regions by radiation melting into a more heavily doped underlying region.
Figure 15:
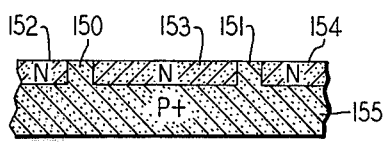

Contact between the surface and a more heavily doped buried region can also be made. Shown in FIG. 14 is an n surface region 142 grown epitaxially on a p+ region 143. Thus, the entire doping of the n region consists of n dopant atoms, and no compensated p dopant atoms are initially in the n region. Consider that laser radiation 140 is applied so as to melt through the surface n region into the p+ region. Note that here the laser is melting into the less heavily doped region first. If the melt zone extends far enough into the p+ region so that the p dopant concentration in the melt exceeds the n dopant concentration, the melt will assume a p or p+ doping, depending on how far the melt extends into the p+ region and the difference in doping levels of the n and p+ regions. A p or p+ channel 150 will result, as shown in FIG. 15.

If the n surface of FIG. 14 is initially formed by diffusion or ion implantation of n dopant into the p+ region rather than by epitaxy, so that compensated p dopant atoms are initially in the n region, there will be a higher concentration of n dopant in region 142 than of p dopant in region 143. By the previous definition, region 142 will then actually be the more heavily doped region. Then, an n-type dimple can be formed in the p+ region, similar to the situation in FIG. 2, for a small melt depth past the junction. At a sufficiently large melt depth, the n dopant will diffuse into such a large volume of melt in region 143 that the p dopant concentration in the melt will exceed the n dopant concentration, and the situation shown in FIG. 15 will again be obtained. At some intermediate melt depth between these limits, the n dopant concentration in the melt will equal the p dopant concentration, and a compensated intrinsic region will result (not shown). Note that an intrinsic melt region, or even a p-type melt region, can also be obtained starting with the situation shown in FIG. 1 as well, if the melt extends sufficiently far into the more lightly doped p region so that the p dopant concentration in the melt equals or exceeds the n dopant concentration, respectively.

Comparable situations for isotype junctions can occur. For example, if region 123 of FIG. 12 is n−, then contact can be made from region 122 to region 124 through region 123 in a similar manner as discussed before for FIG. 12. Also, if region 142 of FIG. 14 is p, then contact can be made to region 143 by melting through region 142 into region 143 until the melt assumes a p+ doping level as before. One can even make a connecting channel from the overlying region to a buried doped region through several intermediate regions of different doping levels, if the intermediate regions are not so large or so doped as to prevent the melt from assuming the desired doping level. Also, the overlying regions 122 and 142 need not be surface regions, but can be themselves under other regions if the size and doping of these other regions do not prevent the melt from assuming the doping characteristic desired. Thus, contact between buried regions can be achieved. This ability to make contact to buried regions from the surface, or between buried regions, could find use in the construction of vertically integrated circuits, in which active regions are arranged on top of one another.

The channel can also be used to electrically isolate the two buried p regions 133,134 shown in FIG. 13 by moving the laser so that the channel becomes a trough, seen here in cross section, that completely separates the two p regions. Entire islands of buried p material could be created similarly. Surface regions can also be isolated. In FIG. 15, if the laser is moved along the surface so that channels 150,151 become a trough, an entire area 153 of the n surface can be isolated from the rest of the surface by a perimeter p-n junction, seen here in cross section. This can be used to separate active device areas on a large substrate, or for other purposes.

In addition to the above embodiments, various additional modifications and extensions of this invention will become apparent to those skilled in the art. All such variations and deviations which basically rely on the teachings through which this invention has advanced the art are properly considered to be within the spirit and scope of this invention.

I Claim:

1. A method of making a semiconductor device having a junction between a more heavily doped semiconductor and a less heavily doped semiconductor, the invention characterized by deforming a portion of the junction by directing substantially perpendicularly to the junction a radiation beam selected from the group consisting of laser beam and electron beam, said radiation beam having a diameter less than 100 microns and small compared to the area of the junction, and of sufficient intensity to melt the semiconductor material, until a portion of the more heavily doped region melts into the less heavily doped region.

2. A semiconductor device made in accordance with the method of claim 1 wherein said radiation beam is a laser beam.

3. A method of making a semiconductor device including the step of adjusting the reverse breakdown voltage of a diode having a p-n junction between a more heavily doped region of a given type semiconductor and a less heavily doped region of the opposite type semiconductor, the invention characterized by directing substantially perpendicularly to the junction a radiation beam selected from the group consisting of laser beam and electron beam, said radiation beam having a diameter less than 100 microns and small compared to the area of the p-n junction, and of sufficient intensity to melt the semiconductor material, until a portion of the more heavily doped region melts into the less heavily doped region.

4. The method of claim 3 wherein the invention is further characterized in that the radiation beam is a pulsed radiation beam controlled by monitoring the reverse breakdown voltage of the diode between radiation pulses so that the radiation pulses are terminated when the desired breakdown voltage is obtained.

5. The method of claim 4 wherein the invention is further characterized in that the energy of the radiation pulses is varied by changing the amplitude of the radiation pulses, or by changing the duration of the radiation pulses, or both.

6. A method of making a semiconductor device including the step of changing the minimum channel width of a junction field effect transistor having a junction between a more heavily doped gate region of a given type semiconductor and a less heavily doped channel region of the opposite type semiconductor, the invention characterized by moving across the surface of the gate a radiation beam selected from the group consisting of laser beam and electron beam, said radiation beam being directed substantially perpendicularly to said junction and having a diameter less than 100 microns and small compared to the area of the junction, and of sufficient intensity to melt the semiconductor material, until a trough of the more heavily doped gate region melts into the channel.

7. The method of claims 1 or 6 wherein the invention is further characterized in that the radiation beam is a pulsed radiation beam controlled by monitoring a device parameter between radiation pulses so that the radiation pulses are terminated when the desired parameter value is achieved.

8. The method of claim 7 wherein the invention is further characterized in that the energy of the radiation pulses is varied by changing the amplitude of the radiation pulses, or by changing the duration of the radiation pulses, or both.

9. A method of making a semiconductor device including the step of making contact to a buried doped region in a semiconductor structure having a first junction between a more heavily doped region of a given type semiconductor and a less heavily doped region, and a second junction between said less heavily doped region and a buried doped region, the invention characterized by directing substantially perpendicularly to said first and second junctions a radiation beam selected from the group consisting of laser beam and electron beam, said radiation beam having a diameter less than 100 microns and small compared to the area of said first junction, and of sufficient intensity to melt the semiconductor, until a melt region extends from said more heavily doped region through said junctions into said buried doped region.

10. A method of making a semiconductor device including the step of making contact from a first region to a second region in a semiconductor structure having two or more junctions between said first region and said second region, the invention characterized by directing substantially perpendicularly to said junctions a radiation beam selected from the group consisting of laser beam and electron beam, said radiation beam having a diameter less than 100 microns and small compared to the area of said junctions, and of sufficient intensity to melt the semiconductor material, until a melt region extends from said first region through said junctions into said second region.

11. A method of making a semiconductor device having a junction between a less heavily doped semiconductor and a more heavily doped semiconductor, the invention characterized by deforming a portion of the junction by directing substantially perpendicularly to the junction a radiation beam selected from the group consisting of laser beam and electron beam, said radiation beam having a diameter less than 100 microns and small compared to the area of the junction, and of sufficient intensity to melt the semiconductor material, until a portion of the less heavily doped region melts into the more heavily doped region.

12. A semiconductor device made in accordance with the method of claim 11 wherein said radiation beam is a laser beam.

13. A method of making a semiconductor device including the step of isolating a portion of a buried doped region from the rest of a buried doped region in a semiconductor structure having a junction between said buried region and an overlying more heavily doped region of the opposite type semiconductor, the invention characterized by directing around the portion of the more heavily doped region overlying the perimeter of the buried doped region to be isolated a radiation beam selected from the group consisting of laser beam and electron beam, said radiation beam being directed substantially perpendicularly to said junction and having a diameter less than 100 microns and small compared to the area of said junction, and of sufficient intensity to melt the semiconductor material, until a trough melts through said overlying region into said buried region a depth at least equal to the maximum depth of said buried region.

14. A method of making a semiconductor device including the step of isolating a portion of a surface region from the rest of a less heavily doped semiconductor surface region in a semiconductor structure having a junction between said surface region and a more heavily doped region having a doping characteristic of the opposite type semiconductor, the invention characterized by directing around the perimeter of the portion of the surface region to be isolated a radiation beam selected from the group consisting of laser beam and electron beam, said radiation beam being directed substantailly perpendicularly to said junction and having a diameter less than 100 microns and small compared to the area of said junction, and of sufficient intensity to melt the semiconductor material, until a trough melts through the surface region along said perimeter into the more heavily doped region a distance sufficient to ensure that the melt assumes substantially the doping characteristic of the more heavily doped region.

15. A method of making a semiconductor device including the step of making contact to a more heavily doped buried region having a certain doping characteristic in a semiconductor structure having a junction between a less heavily doped overlying region and the more heavily doped buried region, the invention characterized by directing substantially perpendicularly to said junction a radiation beam selected from the group consisting of laser beam and electron beam, said radiation beam having a diameter less than 100 microns and small compared to the area of said junction, and of sufficient intensity to melt the semiconductor material, until a melt region is formed extending from said overlying region sufficiently far into said buried region so that said melt region assumes substantially the doping characteristic of said buried region.

* * * * *

UNITED STATES PATENT AND TRADEMARK OFFICE
CERTIFICATE OF CORRECTION

PATENT NO. : 4,203,781
DATED : May 20, 1980
INVENTOR(S) : Gabriel L. Miller

It is certified that error appears in the above-identified patent and that said Letters Patent are hereby corrected as shown below:

In the Abstract, line 7, "recyrstallizes" should read --recrystallizes--. Column 3, line 32, after "p-p$^+$ junctions" insert --and--. Column 3, line 46, "function" should read --junction--. Column 4, line 21, "n$^+0$" should read --n$^+$--. Column 6, line 28, "higher" should read --high--.

Signed and Sealed this

Nineteenth Day of August 1980

[SEAL]

Attest:

SIDNEY A. DIAMOND

Attesting Officer

Commissioner of Patents and Trademarks